(12) United States Patent
Marsden et al.

(10) Patent No.: US 11,061,061 B2
(45) Date of Patent: Jul. 13, 2021

(54) SYSTEM AND APPARATUS FOR DETECTING FAULTS IN AN INSULATION LAYER OF A BURIED CONDUCTOR

(71) Applicant: RADIODETECTION LIMITED, Bristol (GB)

(72) Inventors: Mark Marsden, Bristol (GB); Peter Mann, Bristol (GB); Charles Alexander, Bristol (GB); Jeff Thompson, Bristol (GB)

(73) Assignee: Radiodetection Limited, Bristol (GB)

( * ) Notice: Subject to any disclaimer, the term of this patent is extended or adjusted under 35 U.S.C. 154(b) by 0 days.

(21) Appl. No.: 16/349,894

(22) PCT Filed: Nov. 15, 2017

(86) PCT No.: PCT/GB2017/053430
§ 371 (c)(1),
(2) Date: May 14, 2019

(87) PCT Pub. No.: WO2018/091883
PCT Pub. Date: May 24, 2018

(65) Prior Publication Data
US 2020/0064390 A1    Feb. 27, 2020

(30) Foreign Application Priority Data
Nov. 15, 2016   (GB) ...................................... 1619334

(51) Int. Cl.
*G01R 31/08*    (2020.01)
(52) U.S. Cl.
CPC ................................. *G01R 31/083* (2013.01)

(58) Field of Classification Search
CPC .... G01R 31/08; G01R 31/081; G01R 31/083; G01R 31/085; G01R 31/086; G01R 31/12; G01R 31/50; G01R 31/58; G01R 31/00
See application file for complete search history.

(56) References Cited

U.S. PATENT DOCUMENTS

| 3,991,363 A | 11/1976 | Lathrop |
| 5,347,212 A | 9/1994 | Bass et al. |

(Continued)

FOREIGN PATENT DOCUMENTS

| GB | 2459770 A | 11/2009 |
| RU | 160147 U1 | 3/2016 |

OTHER PUBLICATIONS

International Search Report from PCT/GB2017/053430; dated Mar. 22, 2018.

*Primary Examiner* — Tung X Nguyen
*Assistant Examiner* — Feba Pothen
(74) *Attorney, Agent, or Firm* — BakerHostetler

(57) ABSTRACT

Methods, systems and locators for detecting faults in an insulation layer of an insulated conductor buried beneath a ground surface are described. The locator comprises a magnetometer arranged to detect a magnetic field generated by the alternating current and to generate a current signal on the basis of the detected magnetic field, and an Alternating Voltage Gradient receiver comprising a pair of probes arranged to make electrical contact with the ground surface, which is arranged to generate a voltage signal indicative of a voltage between the pair of probes. A processor is configured to substantially synchronously sample the current signal and the voltage signal. This enables improved detection of faults in the insulation layer of the insulated conductor.

43 Claims, 9 Drawing Sheets

(56) References Cited

U.S. PATENT DOCUMENTS

| | | | |
|---|---|---|---|
| 5,828,219 A | 10/1998 | Hanlon et al. | |
| 9,158,023 B2 | 10/2015 | Stephan | |
| 2009/0027061 A1* | 1/2009 | Curt | H02J 13/00002 |
| | | | 324/539 |
| 2010/0318402 A1 | 12/2010 | Nielsen et al. | |
| 2011/0191058 A1 | 8/2011 | Nielsen et al. | |
| 2013/0200901 A1* | 8/2013 | Olsson | G01V 3/081 |
| | | | 324/326 |
| 2016/0169953 A1* | 6/2016 | Skipper | G01K 7/20 |
| | | | 324/543 |
| 2016/0299183 A1* | 10/2016 | Lee | G01R 31/083 |
| 2017/0131339 A1* | 5/2017 | Inamoto | G01R 31/50 |

\* cited by examiner

SYSTEM AND APPARATUS FOR DETECTING FAULTS IN AN INSULATION LAYER OF A BURIED CONDUCTOR

CROSS-REFERENCE TO RELATED APPLICATIONS

The present application is a National Stage of International Patent Application No. PCT/GB2017/053430, filed on Nov. 15, 2017, and claims priority to United Kingdom Patent Application No. 1619334.4, filed on Nov. 15, 2016, the contents of which are incorporated herein by reference in their entirety.

TECHNICAL FIELD

The present invention relates to detecting faults in an insulation layer of an insulated conductor buried beneath a ground surface.

BACKGROUND

Buried metal pipelines are typically coated with a layer of insulating material to act as a barrier to current flow between the pipe and ground, in order to minimise the possibility of electrolytic corrosion. To add further protection, the conventional use of cathodic protection systems applies a standing DC voltage of negative potential to the pipe, in order to ensure that any electrolytic corrosion that does occur in the event of coating defects or damage is confined to so-called ground beds which act as sacrificial anodes, and the positive terminals for the voltage. Such ground beds typically cover an area of tens of square metres near the cathodic protection application point.

Over extended periods of time, faults in the insulating material can result in degradation of the pipeline, and so the condition of pipelines is typically surveyed regularly. Such surveys involve comparative measurement of resistance to ground of pipeline sections; by storing the information gained from successive surveys, any change in the condition of the pipeline can be detected, and corrective action taken.

Various methods of surveying are known. In one such survey, an alternating current is injected into the pipe, and a hand-held receiver is used firstly to locate the position of the pipe and then, by measuring depth and signal strength, to determine the amplitude of the injected signal current at each position. From these measurements at known distances along the pipe, the rate of loss of signal voltage and current can be plotted to identify faults in the insulating material.

SUMMARY

According to a first aspect of the present invention, there is provided locator for detecting faults in an insulation layer of an insulated conductor buried beneath a ground surface, the insulated conductor carrying an alternating current, the locator comprising:
a magnetometer arranged to detect a magnetic field generated by the alternating current and to generate a current signal on the basis of the detected magnetic field;
an Alternating Voltage Gradient receiver comprising a pair of probes arranged to make electrical contact with the ground surface, the Alternating Voltage Gradient receiver being arranged to generate a voltage signal indicative of a voltage between the pair of probes; and
a processor configured to substantially synchronously sample the current signal and the voltage signal.

According to a second aspect of the present invention, there is provided a system for detecting faults in an insulation layer of an insulated conductor buried beneath a ground surface, the system comprising:
a locator comprising:
a magnetometer arranged to detect a magnetic field generated by the alternating magnetic current and to generate a current signal in response to detecting the magnetic field;
an Alternating Voltage Gradient receiver comprising a pair of probes arranged to make electrical contact with the ground surface, the Alternating Voltage Gradient receiver being arranged to generate a voltage signal indicative of a voltage between the pair of probes; and
a processor configured to process the current signal and the voltage signal substantially simultaneously; and
a signal generator arranged to apply an alternating current to the buried conductor.

According to a third aspect of the present invention, there is provided a method of detecting faults in an insulation layer of an insulated conductor buried beneath a ground surface, the method comprising:
applying an alternating current to the buried conductor;
simultaneously detecting a magnetic field generated by the alternating current with a magnetometer located above the ground surface and measuring a voltage between a pair of probes in electrical contact with the ground surface;
generating a current signal on the basis of the detected magnetic field and generating a voltage signal indicative of the measured voltage; and
processing the current signal and the voltage signal substantially simultaneously.

According to a fourth aspect of the present invention, there is provided a non-transitory machine-readable storage medium storing instructions that, when executed by a processor in a portable computing device, cause the processor to:
simultaneously receive current and voltage measurements, the current measurement being based on a current signal generated on the basis of a magnetic field detected with a magnetometer located above the ground surface and the voltage measurement being based on a voltage signal measured between a pair of probes in electrical contact with the ground surface;
determining a phase difference between the current signal and voltage signal; and
display the current and voltage measurements and the determined phase difference at the portable computing device.

According to a fifth aspect of the present invention, there is provided a non-transitory machine-readable storage medium storing instructions that, when executed by a processor in a locator for detecting faults in an insulation layer of an insulated conductor buried beneath a ground surface, cause the processor to:
receive a current signal generated by a magnetometer in response to the magnetometer detecting a magnetic field;
receive a voltage signal generated by an Alternating Voltage Gradient receiver, the voltage signal being indicative of a voltage between a pair of probes of the Alternating Voltage Gradient receiver; and
process the current and voltage signals simultaneously.

Further features and advantages of the invention will become apparent from the following description of preferred embodiments of the invention, given by way of example only, which is made with reference to the accompanying drawings.

DETAILED DESCRIPTION

Standard industry practice is to perform multiple surveys on any given pipeline to confirm the presence of faults in the insulating material. Typically, after a first survey is performed, the operator or a suitably trained surveyor, reviews the measured data to identify potential faults in the insulating material. A second survey, using a different measurement technique, is then performed around locations where potential faults in the insulating material have been identified. For example, a first survey may be performed using the method described above. The first survey may identify possible locations of faults in the insulating material. Then a second survey may be performed using a different or more accurate fault detection technique. However, surveying a pipeline in this way relies on the first survey identifying all potential faults in the insulating material; otherwise the second survey will not be carried out in locations where a potential fault in the insulating material is missed and the fault will not be identified.

Figure 1:
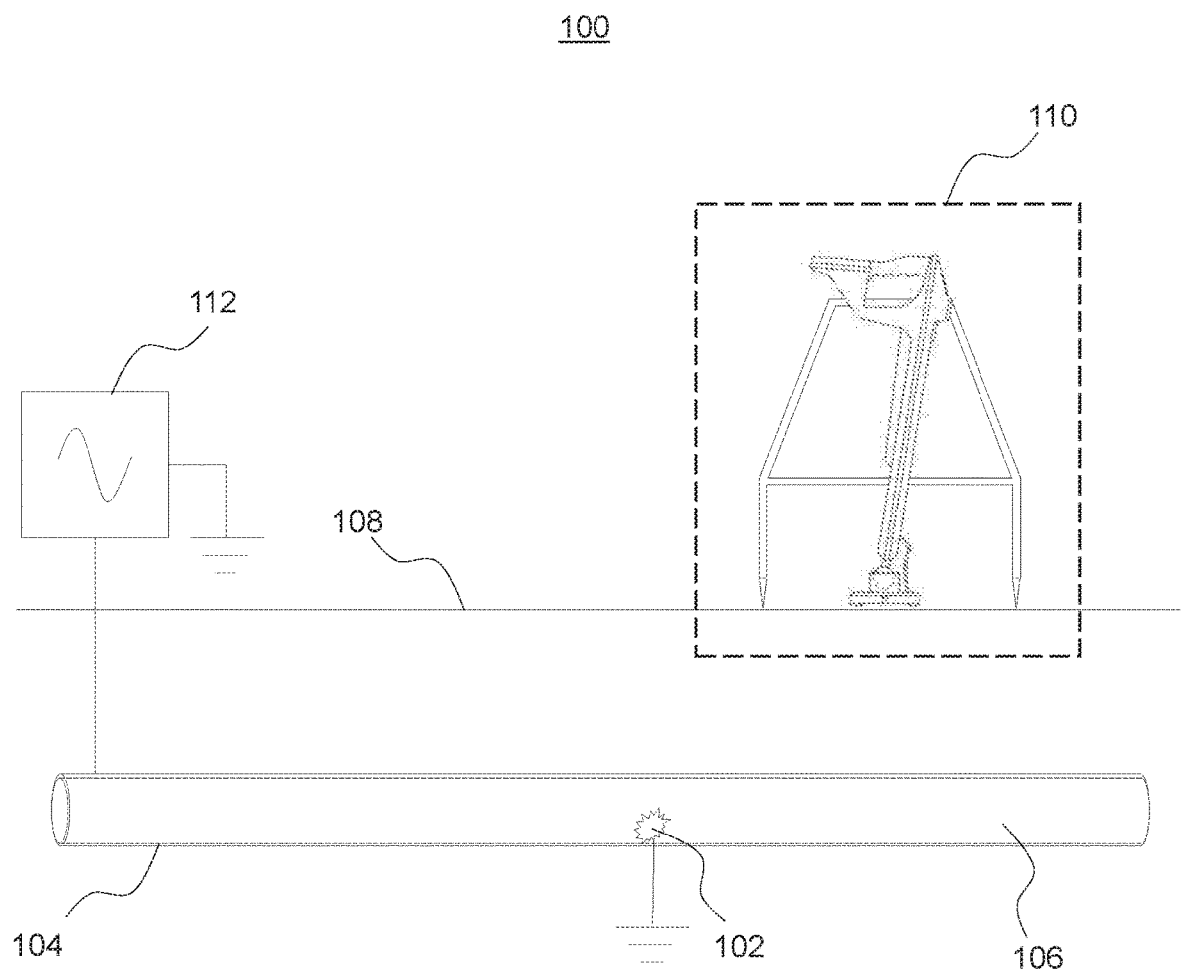
FIG. 1 is a schematic diagram showing a system for detecting faults in an insulation layer of an insulated conductor buried beneath a ground surface, according to an example.

FIG. 1 shows an example system 100 for detecting faults 102 in an insulation layer 104 of an insulated conductor 106 buried beneath a ground surface 108. The system 100 includes a fault detector 110 and a signal generator, referred to herein as a transmitter 112.

The transmitter 112 is arranged to apply an alternating current to the buried conductor 106. The signal generated by the transmitter 112 comprises one or more frequency components. In certain examples, the transmitter 112 generates one or more frequency components in a low frequency range for finding faults in the insulating layer 104, and one or more frequency components in a relatively higher frequency range (referred to hereinafter as the high frequency range) for locating the buried conductor 106 and/or determining the depth of the buried conductor 106 beneath the ground surface 108.

In some examples, in the low frequency range, the transmitter 112 may generate one or more signals having a frequency less than 10 Hz for finding faults in the insulating layer 104. For example, the transmitter 112 may generate a 4 Hz signal. In another example, the transmitter 112 may generate a 4 Hz signal and an 8 Hz signal.

In some examples, in the high frequency range, the transmitter 112 may generate one or more signals having a frequency higher than 10 Hz for locating the buried conductor 106 and/or determining the depth of the buried conductor 106 beneath the ground surface 108. For example, the transmitter 112 may generate a 128 Hz signal. In another example, the transmitter 112 may generate a 98 Hz signal. In some examples, the transmitter 112 may generate two or more signals in the high frequency range to enable the locator 110 to determine the depth at more than one frequency.

In some examples, the transmitter 112 may be conductively coupled to an exposed portion of the buried conductor. In this case, one terminal of the transmitter 112 is connected directly, by an operator, to the pipe or cable at an access point such as a valve, meter or end of the conductor and the circuit is completed by a connection of another terminal of the transmitter 112 to a ground stake or other ground connection point.

Figure 2:
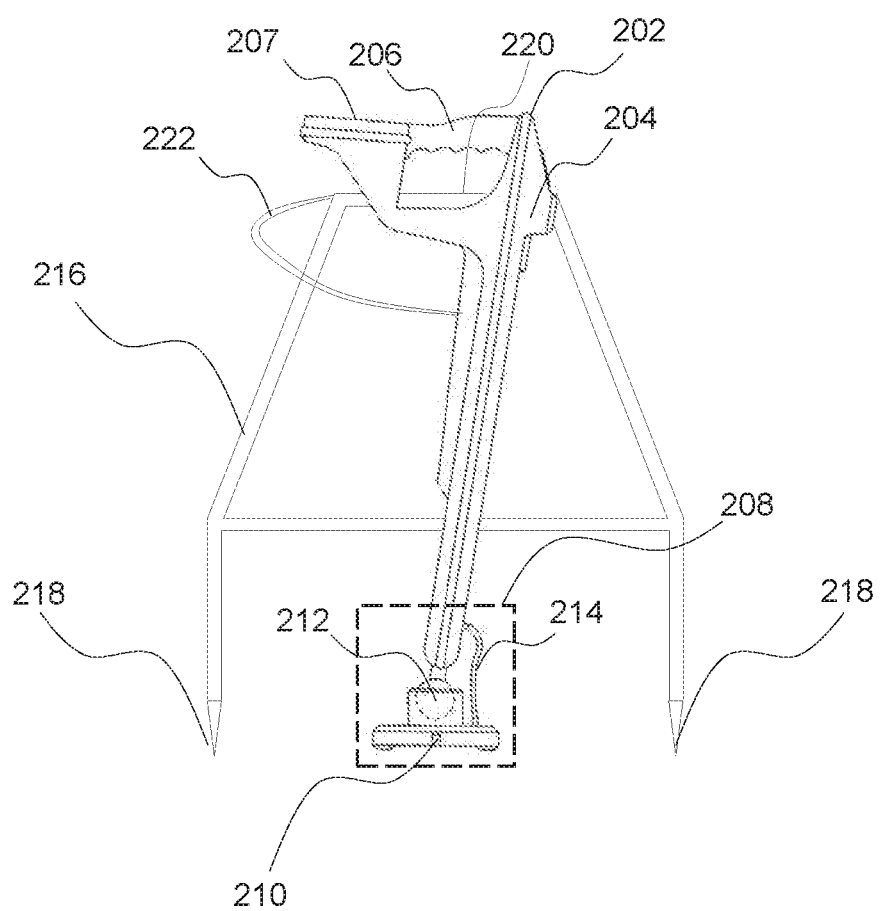
FIG. 2 is a schematic diagram showing a fault detector for detecting faults in an insulation layer of an insulated conductor buried beneath a ground surface, according to an example.

FIG. 2 shows an example of a fault detector 200. The fault detector 200 includes a locator 202. The locator 202 comprises a housing 204 which contains components for detecting a buried conductor as described below with reference to FIG. 3. The housing 204 comprises a handle 206 which is held in one hand of a user during use of the fault detector 200. Adjacent to the handle 206 is a display 207 for displaying information to the user is while holding the locator 202. The housing 204 has a section which extends from the handle 206 towards the ground surface 108 during use, which may contain antennas for detecting high frequency magnetic fields, such as a 128 Hz magnetic field, generated by current flowing in a buried conductor, such as the current applied by the transmitter 112.

A foot unit 208 is connected to the locator 202. The foot unit 208 houses a magnetometer 210 which is arranged to detect low frequency magnetic fields, such as a 4 Hz magnetic field, generated by current flowing in a buried conductor, such as the current applied by the transmitter 112. The foot unit 208 contains a ball-and-socket joint 212 and the magnetometer 210 is electrically connected to components within the housing 204 via an electrical connection 214. The ball-and-socket joint 212 allows the foot unit 208 to remain in the same orientation with respect to the ground surface 108 if the locator 202 is moved relative to the plane of the ground surface.

The fault detector 200 also comprises an Alternating Voltage Gradient receiver, referred to herein as a voltage A-frame 216. The voltage A-frame 216 comprises a pair of probes 218. The probes 218 are arranged to make electrical contact with the ground surface 108, and to generate a voltage signal indicative of a potential difference between the probes 218. The voltage A-frame 216 also comprises a handle 220 by which the voltage A-frame 216 is held in a second hand of the user during use of the fault detector 200. The voltage A-frame is electrically connected to components within the housing 204 by a cable 222.

In some examples, the foot unit 208 and/or the voltage A-frame 216 are dis-connectable from the locator 202. In other examples, the foot unit 208 and/or the voltage A-frame 216 are integral with the locator 202.

Figure 3:
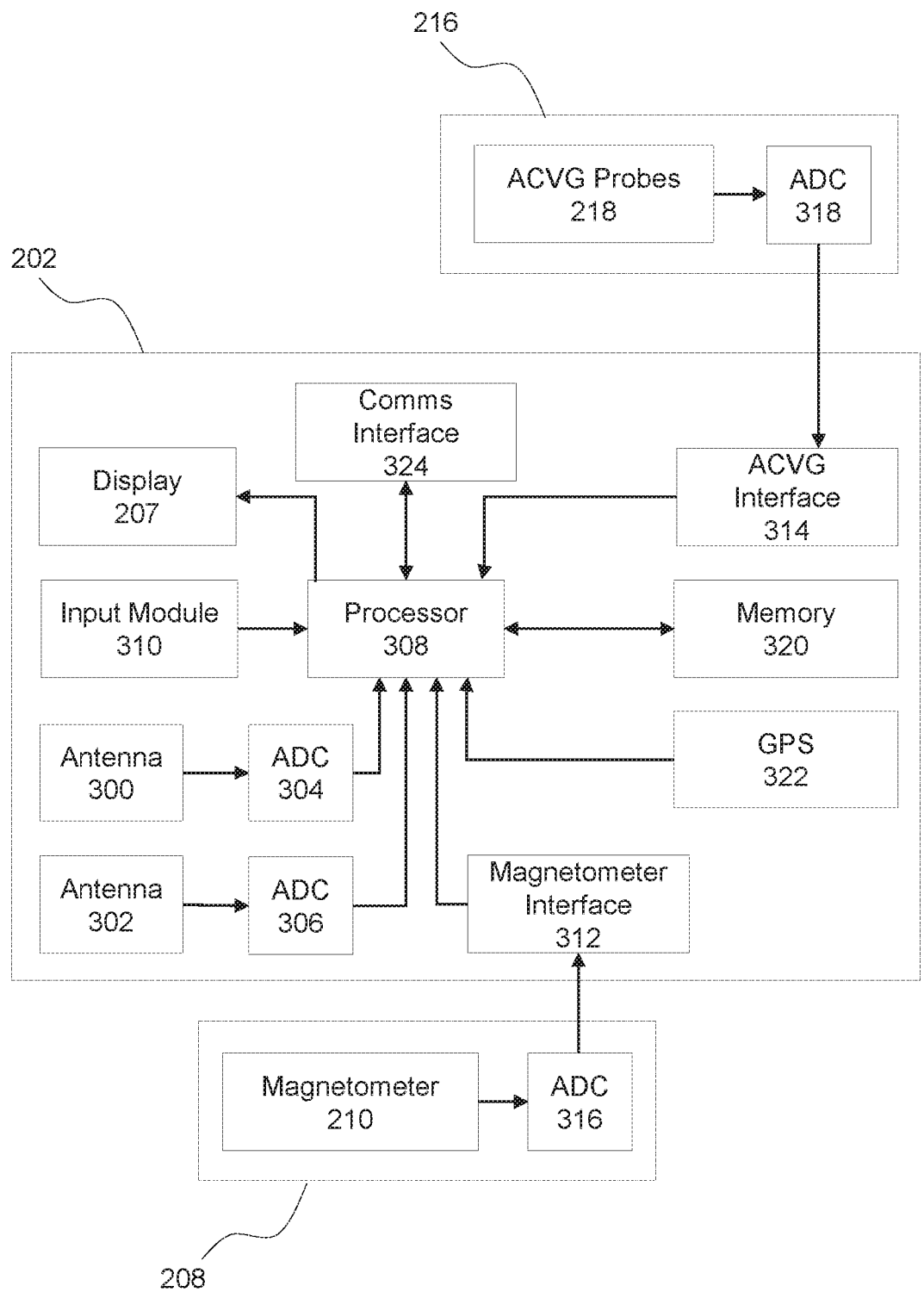
FIG. 3 is a block diagram showing electronic components of a fault detector for detecting faults in an insulation layer of an insulated conductor buried beneath a ground surface, according to an example.

FIG. 3 shows the electronic components of the fault detector 200. The locator 202 comprises a pair of vertically spaced antennas comprising a top antenna 300 and a bottom antenna 302 that are arranged to detect high frequency magnetic fields generated by current applied by the transmitter 112. The antennas 300, 302 are arranged with their axes parallel and spaced apart so that in use the bottom antenna 302 will be directly below the top antenna 300, their axes being horizontal. Each antenna 300, 302 produces an electrical signal which is received by a respective analogue-to-digital converter (ADC). A first ADC 304 converts electrical signals from the top antenna 300 into a first digital signal and a second ADC 306 converts electrical signals from the bottom antenna 302 into a second digital signal. The processor 308 is configured to receive the first and second digital signals and to calculate an estimate of the depth of the buried conductor based on the relative magnitudes of the magnetic fields represented by the first and second digital signals (i.e. detected by the top and bottom antennas 300, 302).

The processor 308 is configured to receive input data from an input module 310. For example, the input module 310 may be a key pad, or a touch-screen input device via which the user can input commands. The processor 308 is connected to the display 207 and may cause the display 207 to display information to the user. In some examples, the display 207 and the input module 310 may be a single touch-screen display.

The locator 202 comprises a magnetometer interface 312 for receiving a current signal from the foot unit 208 and an ACVG interface 314 for receiving a voltage signal from the voltage A-frame 216. The foot unit 208 comprises an ADC 316 for digitising the current signal for sending to the processor 308 via the magnetometer interface 312. Similarly, the voltage A-frame 216 comprises an ADC 318 for digitising the voltage signal for sending to the processor 308 via the ACVG interface 314.

The processor 308 executes instructions stored in a memory 320 contained within the locator 202. In order to operate the fault detector 200 to detect faults such as the fault 102 in the insulation layer 104 of the insulated conductor 106, the user may select a fault detection mode of the locator 202 by inputting an appropriate input to the input module 310. To use the fault detector 200 in the fault detection mode, the user carries the locator 202 to which the foot unit 208 is connected in one hand and carries the voltage A-frame 216 in another hand. Having located the buried conductor 106, the user carries the locator 202 and the voltage A-frame 216 along the path of buried conductor 106. In some examples, in the fault detection mode, the user may be required to stop at regular distance intervals to take current and voltage measurements. In other examples, the fault detector 200 may sample current and voltage measurements at regular time intervals.

In the fault detection mode, the processor 308 is arranged to process the current signal received from the foot unit 208 and the voltage signal received from the voltage A-frame simultaneously. Current and voltage measurements that are simultaneously processed by the processor 308 are stored in the memory 320 by the processor 308. In some examples, the processor may be configured to simultaneously display the current and voltage amplitude and phase measurements to the user in real time (i.e. as the user is operating the fault detector 200).

As explained above, prior art methods of surveying buried conductors for faults in their insulation typically require two or more surveys to be conducted at different times and/or by different operators. One reason for this is that prior art apparatus for conducting different types of survey only allow for one type of measurement to be performed and processed at a time.

Measuring current and voltage signals simultaneously enables a phase difference between the current and voltage at a given location to be determined. For example, the phase difference between current and voltage signals at 4 Hz may be determined. Such phase information is not available where current and voltage signals are measured separately, at different times.

In some examples, the phase difference may be used to evaluate the length of a fault 102 in the insulation layer 104. The voltage phase undergoes a polarity transition before and after the fault 102. A small fault may result in a distinct phase change and/or a rapid rate of phase change around the fault 102, whereas a larger fault (extending along a greater length of the conductor 106) may result in a phase change that is highly disturbed and/or extends over a greater distance.

In some examples, the processor 308 is configured to, in use, obtain survey measurement data, the survey measurement data comprising, for each of a plurality of different positions along a survey path traversed by the fault detector 200 during a survey, a current measurement based on the current signal and a voltage measurement based on the voltage signal.

The survey measurement data obtainable by the processor 308 may further comprise for each of the plurality of different positions along the survey path a phase difference measurement of the phase difference between the current signal and the voltage signal.

The processor 308 may be configured to determine, based upon how the phase difference measurements vary with distance over a section of the survey path, information regarding the length of a fault (for example, an estimate of the length of the fault) located in an insulation layer of an insulated conductor buried beneath the ground surface under that section of the survey path.

In some examples, the locator 202 may comprise a location determining unit, such as a global positioning unit (GPS) 322. In such examples, the processor 308 may be arranged to store position information corresponding to a position where current and voltage measurements were simultaneously measured in the memory 320.

In certain examples, the locator 202 may comprise one (as shown) or more communications interfaces 324. The one or more communications interfaces 324 may be arranged to transmit and/or receive data to and/or from other computing devices. For example, the one or more communications interfaces 324 may enable communications via Bluetooth, WiFi, WiMAX, and/or any other kind of proprietary communications and signalling technologies. The one or more communications interfaces 324 may include a transceiver. The transceiver may provide radio and signal processing as needed to transmit and/or receive data to and/or from other computing devices or to access a network.

Figure 4:
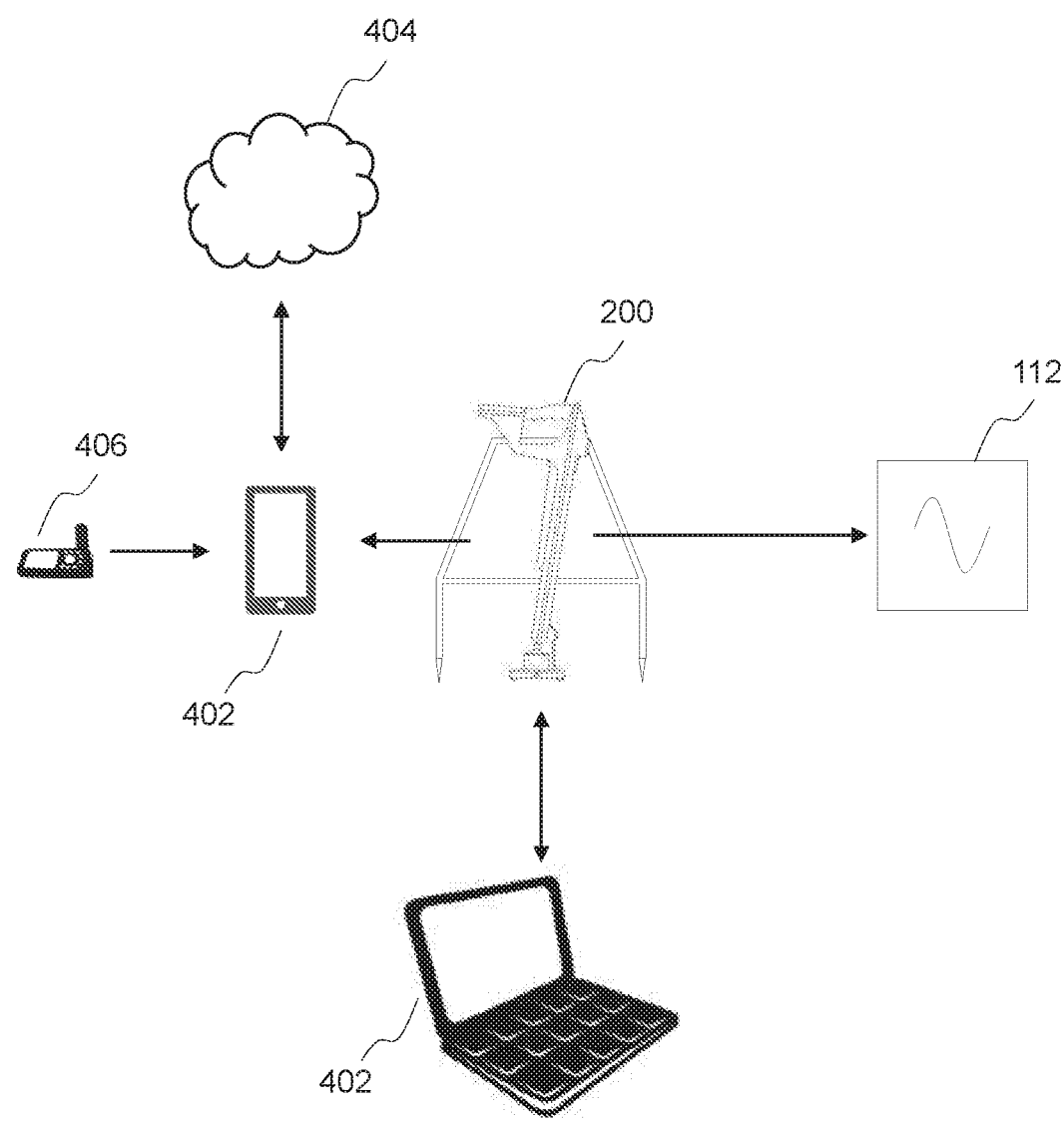
FIG. 4 is a schematic diagram showing a system for detecting faults in an insulation layer of an insulated conductor buried beneath a ground surface, according to an example.

FIG. 4 shows another example of a system 400 for detecting faults in an insulation layer of an insulated buried conductor. Similar to the system described above with reference to FIG. 1, the system comprises a fault detector, such as the fault detector 200 described above with reference to FIG. 2, and a transmitter 112.

In some examples, the fault detector 200, with the locator 202 set in fault detection mode, may send a command to the transmitter 112 to cause the transmitter 112 to generate the low frequency component. In some examples, the command may be sent via the one or more communications interfaces 324

In some examples, the fault detector 200 (e.g. the locator 202) may be connected to one or more computing devices 402 via the one or more communications interfaces 324. For example, the locator 202 may be paired with a portable computing device, such as a tablet or smartphone, via a Bluetooth connection and/or any other kind of proprietary communications and signalling technologies. In another example, the locator 202 may be networked with a portable computing device, such as a laptop personal computer, via a WiFi connection and/or any other kind of proprietary communications and signalling technologies.

The computing device 402 may execute an application for receiving data from the fault detector 200. In some examples, the application may process and/or analyse data received from the fault detector 200, as described below with reference to FIG. 8. This may provide a larger, or higher quality, display on which to display information relating to detected faults to the user.

In some examples, the computing device may be arranged to connect to a communications network. The communications network may include one or more of a cellular network, a wireless local area network, a wired local area network, a wide area network, a wired telecommunications network, and the internet 404. For example, the communications network may include one or more of Global System for Mobile Communications (GSM), Universal Mobile Telecommunications System (UMTS), Long Term Evolution (LTE), 5G (5th generation mobile networks or 5th generation wireless systems), fixed wireless access (such as IEEE 802.16 WiMax), wireless networking (such as IEEE 802.11 WiFi and IEEE 802.15 ZigBee) and/or any other kind of proprietary communications and signalling technologies. Data relating to data received from the fault detector 200 may be transmitted via the communications network and stored remotely for off-site review and/or analysis.

In some examples, the computing device 402 may comprise a position determining unit, such as a GPS unit instead of or in addition to the GPS unit 322 described above in relation to FIG. 3. In some examples, the computing device 402 may store position information corresponding to a position where current and voltage measurements were simultaneously measured in a memory of the computing device 402. Such position information may be used to confirm or augment the accuracy of previously stored position information, or provide position information where that information has not been recorded by the locator 202; for example, where the locator transmits current and voltage measurements to the computing device 402 in real time without position information.

In some examples, the computing device may be additionally or alternatively paired with a dedicated GPS device 406, and the computing device 402 may store position data based on position information provided by the GPS device 406. This may, for example, provide more accurate information regarding the position where current and voltage measurements were simultaneously measured.

In some examples, the transmitter 112 may be provided with a position determining unit, such as a GPS unit. In such examples, since the position of the transmitter 112 is generally fixed during a fault detection survey, the position of the transmitter 112 may be determined with a high degree of accuracy and a differential position measurement (such as a differential GPS measurement) may be made by comparing position information determined by the GPS unit of the locator 202, or the computing device 402, or the GPS device 406, with the position of the transmitter 112.

Figure 5:
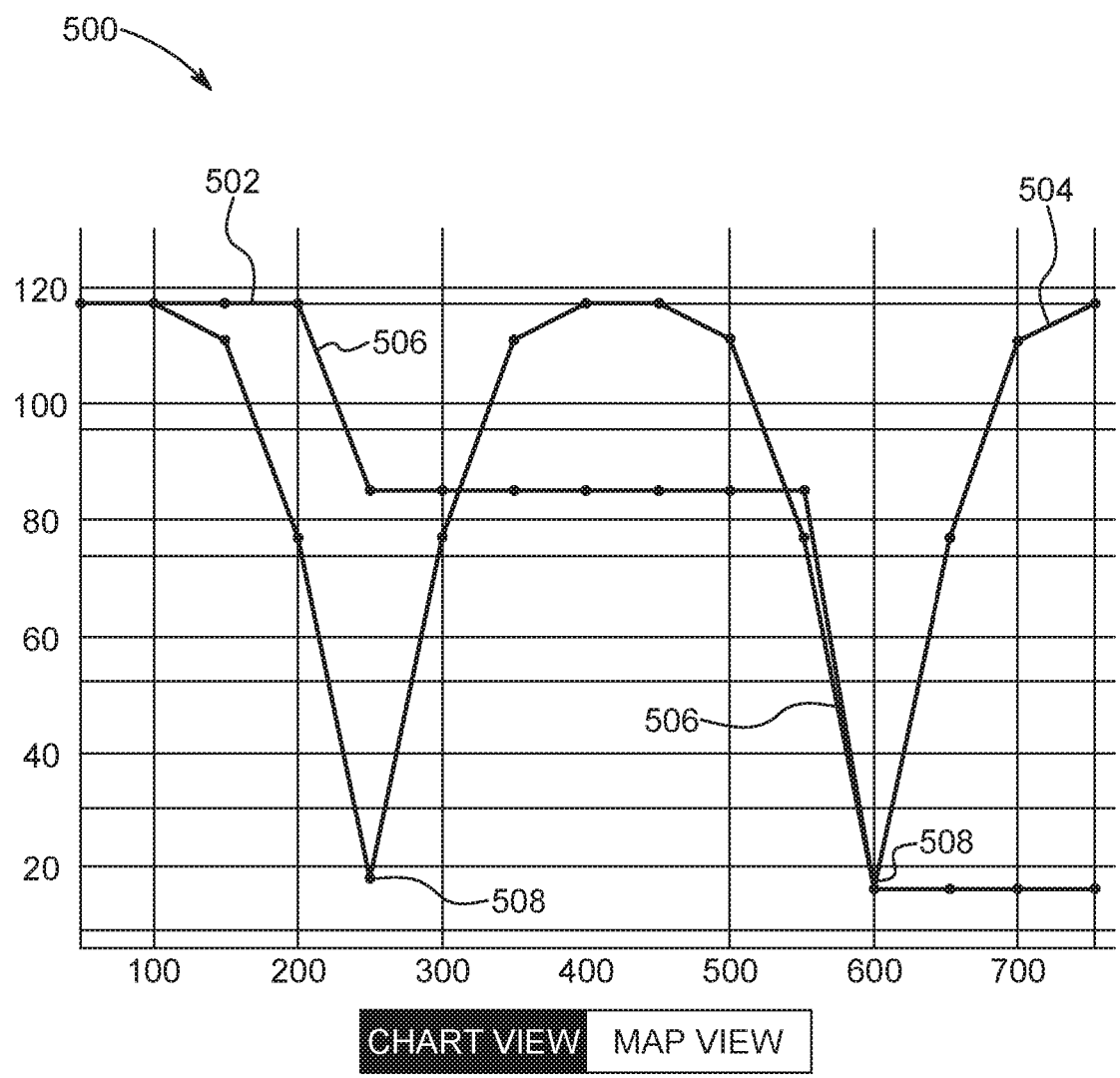
FIG. 5 is a display screen provided by an application according to an example.

FIG. 5 shows a first example of a display screen 500 that may be provided by an application running for processing the current and voltage measurements.

In FIG. 5, current measurements 502, based on magnetic field measurements made using the magnetometer 210, and voltage measurements 504 made using the voltage A-frame 216, are plotted as a function of distance and simultaneously displayed to the user. This data may be retrieved from the memory 320 of the locator 202 after a survey has been completed, or may be displayed in real time (i.e. during a survey) to the user of the fault detector 200, either on the display 207 of the locator 202 or on a display of a computing device 402 such as a tablet or smartphone.

In some examples, the current and voltage amplitude and phase measurements are displayed in units of degrees, dBmA and dBmV to compensate for higher current flowing in the buried conductor 106 at locations closer to the transmitter 112 and conversely lower current flowing in the buried conductor 106 at locations further from the transmitter 112. Consequently, using the unit of current measurement, equal sized faults yield substantially equal changes in the current and voltage measurements.

As shown in FIG. 5, faults 102 in the insulation layer 104 appear in the current measurements 502 as changes in gradient 506 of the graph of current as a function of distance. Faults 102 in the insulation 104 appear in the voltage measurements as distinct minima 508 in the graph of voltage as a function of distance.

Plotting both current, voltage and phase simultaneously provides the user with more data with which to diagnose faults 102. In contrast with prior methods of surveying a buried conductor, since the current and voltage measurements are taken simultaneously, only one pass of the buried conductor is required. Furthermore, taking both current and voltage measurements simultaneously reduces the likelihood of a fault being missed in a first survey and therefore not being investigated further by a second survey.

Figure 6A:
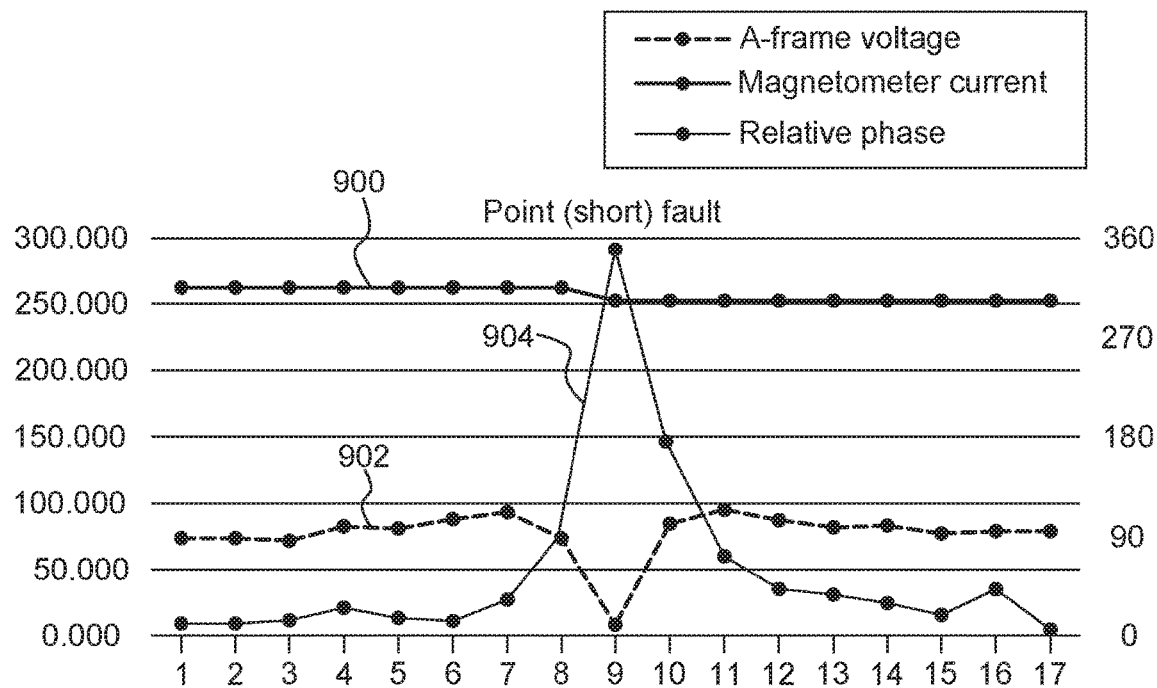
FIGS. 6a and 6b illustrate plots of various measurements as a function of distance in respect of a survey over a point fault and a longer fault respectively.
Figure 6B:
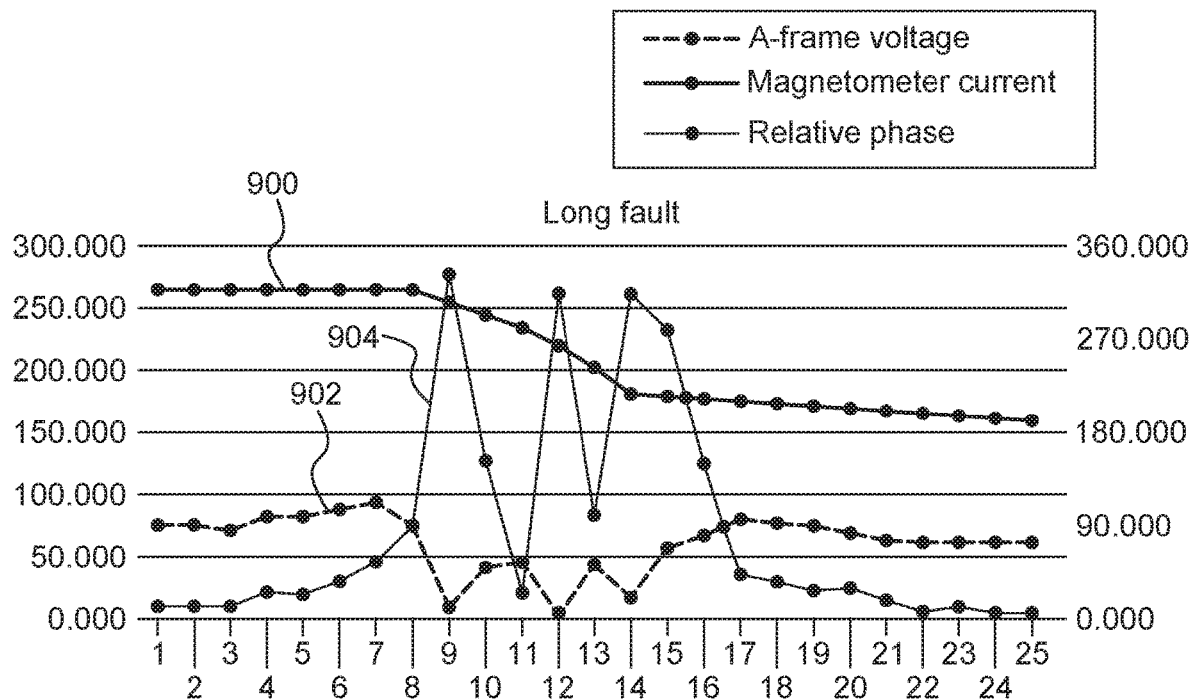

Referring now to FIGS. 6a and 6b, there are illustrated plots of (1) current measurements 900, based on magnetic field measurements made using the magnetometer 210; (2) voltage measurements 902 made using the voltage A-frame 216, and (3) phase difference measurements 904 between the current measurements and the voltage measurements, all three as a function of distance over a section of a survey path traversed by the fault detector 200 during a survey. Each individual measurement is represented as a dot in the plots. The fault detector 200 may comprise any suitable distance measurer, for example, an accelerometer, for measuring distances between measurement points. This distance measuring function may, for example, be performed by the processor 308 and/or any required additional hardware and may be in addition to or instead of any of the GPS functionality described above. In these examples, the distance between measurement points is in the range 5 cm to 50 cm, for example, and is preferably in the range of 10 cm to 30 cm, and is preferably around 20 cm.

As shown in FIG. 6a, a point or relatively short fault in the insulation layer of a buried conductor under the survey path shows in the plot of current measurements 900 as a change in gradient over a short section, in the plot of voltage measurements 902 as a trough, and most noticeably, in the plot of phase difference measurements 904, as a relatively large peak.

As shown in FIG. 6b, a non-point like fault or a longer fault in the insulation layer of a buried conductor under the survey path shows in the plot of current measurements 900 as a change in gradient over a relatively long section, in the plot of voltage measurements 902 as a sequence of three troughs, and most noticeably, in the plot of phase difference measurements 904, as a sequence of three relatively large peaks.

In general, the change or variation in the phase difference measurements taken along the region of a point like or short fault in an insulation will be sharp and well defined whereas the change or variation in the phase difference measurements taken along the region of a longer fault in an insulation will be more random or chaotic but repeatable.

Accordingly, in some examples, the processor 308 is configured to analyse the variation in the phase difference measurements with distance and generate information regarding the length of a detected fault. For example, the processor 308 may generate an estimate of the length of the fault or categorise the fault as being a point fault or a longer fault. This information may be presented to an operator on a display screen of the locator 202.

In other examples, a plot of at least the phase difference measurements as a function of distance may be presented to a user on a display of the fault detector 200 and the user may estimate the length of a fault his or herself based on the plot.

As already discussed above, in some examples, the data obtained by the fault detector 200 may be transmitted to a portable computing device and this device may process/analyse the data and present to a user on a display a plot of at least the phase difference measurements as a function of distance from which a user can estimate the length. Additionally, or alternatively, the portable computing device may generate the information regarding the length of a detected fault, for example, an estimate of the length of the fault or categorise the fault as being a point fault or a longer fault.

Figure 7:
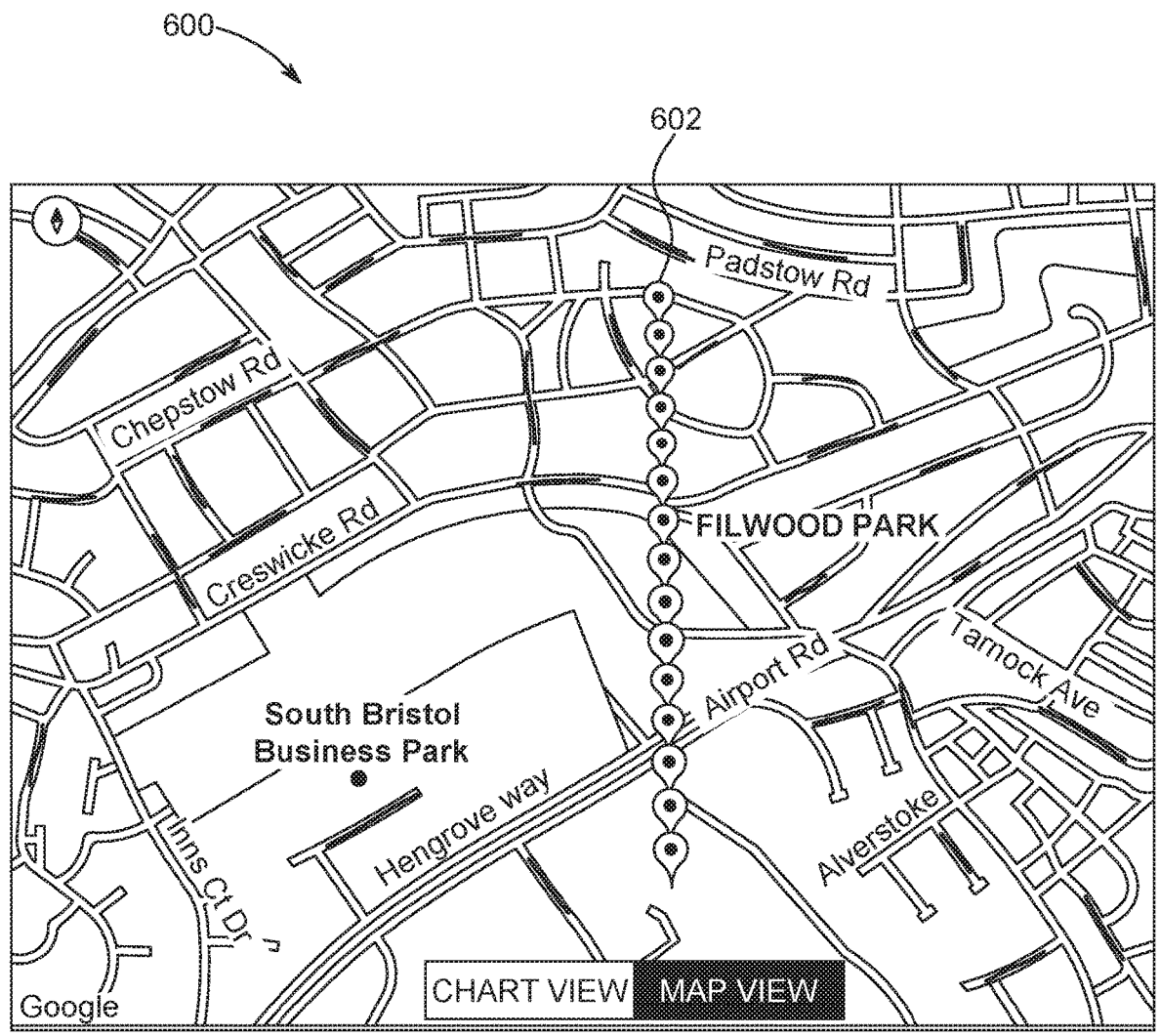
FIG. 7 is a display screen provided by an application according to an example.

It should be appreciated that repeat surveys taken at different times will enable a user to monitor the state of a fault over time and identify whether a fault is stable or changing. For example, a comparison of the plots of the phase difference measurements as a function of distance in the region of a fault taken at different times may indicate that a fault is stable (i.e. the plots are relatively similar), a point fault is corroding into a longer fault (i.e. an earlier plot looks like FIG. 6*a* but a later plot like FIG. 6*b* for example) or that a long fault is increasing in length over time (i.e. the chaotic region in an earlier plot extends over a smaller distance than it does in the later plot). FIG. 7 shows a second example of a display screen 600 that may be provided by an application running for processing the current and voltage measurements. In FIG. 7, positions 602 at which current and voltage measurements were simultaneously made are displayed on a map of the surveyed area. This enables the user to easily and accurately indicate the points on the buried conductor where faults are suspected for future maintenance or repair.

Figure 8:
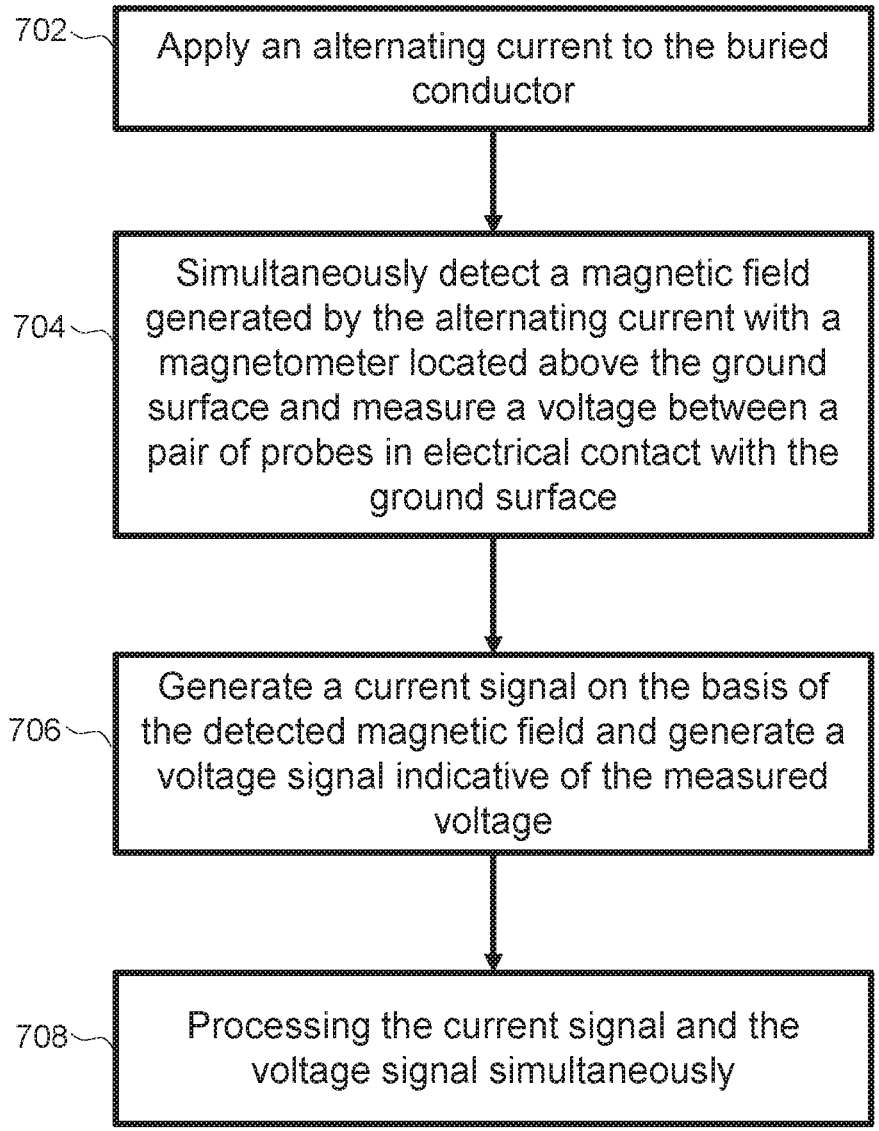
FIG. 8 is a flow diagram showing a method of detecting faults in an insulation layer of an insulated conductor buried beneath a ground surface, according to an example.

FIG. 8 shows a method 700 of detecting faults in an insulation layer of an insulated conductor buried beneath a ground surface, according to an example.

At block 702, an alternating current is applied to the buried conductor. The alternating current may comprise one or more frequency components in a low frequency range for finding faults in the insulating layer 104, and one or more frequency components in a high frequency range for locating the buried conductor 106 and/or determining the depth of the buried conductor 106 beneath the ground surface 108.

In some examples, in the low frequency range, one or more signals having a frequency less than 10 Hz may be generated for finding faults in the insulating layer 104. For example, a 4 Hz signal may be generated. In another example, a 4 Hz signal and an 8 Hz signal may be generated by the transmitter.

In some examples, in the high frequency range, one or more signals having a frequency higher than 10 Hz may be generated for locating the buried conductor 106 and/or determining the depth of the buried conductor 106 beneath the ground surface 108. For example, a 128 Hz signal may be generated. In some examples, two or more signals in the high frequency range may be generated to enable the depth to be determined at more than one frequency.

At block 704, a magnetic field generated by the alternating current is detected with a magnetometer located above the ground surface and simultaneously, a voltage between a pair of probes in electrical contact with the ground surface is measured.

At block 706, a current signal is generated on the basis of the detected magnetic field and a voltage signal indicative of the measured voltage is generated.

At block 708, the current signal and the voltage signal are processed simultaneously. For example, the current signal and the voltage signal may be stored as current and voltage measurements corresponding to a single location in a memory. In another example, the current signal and the voltage signal may be transmitted as current and voltage measurements corresponding to a single location to a computing device for analysis.

As described above, certain methods and systems as described herein may be implemented by a processor that processes computer program code that is retrieved from a non-transitory storage medium. For example, the method 700 may be implemented by computer program code that is implemented by a computing device 402.

Figure 9:
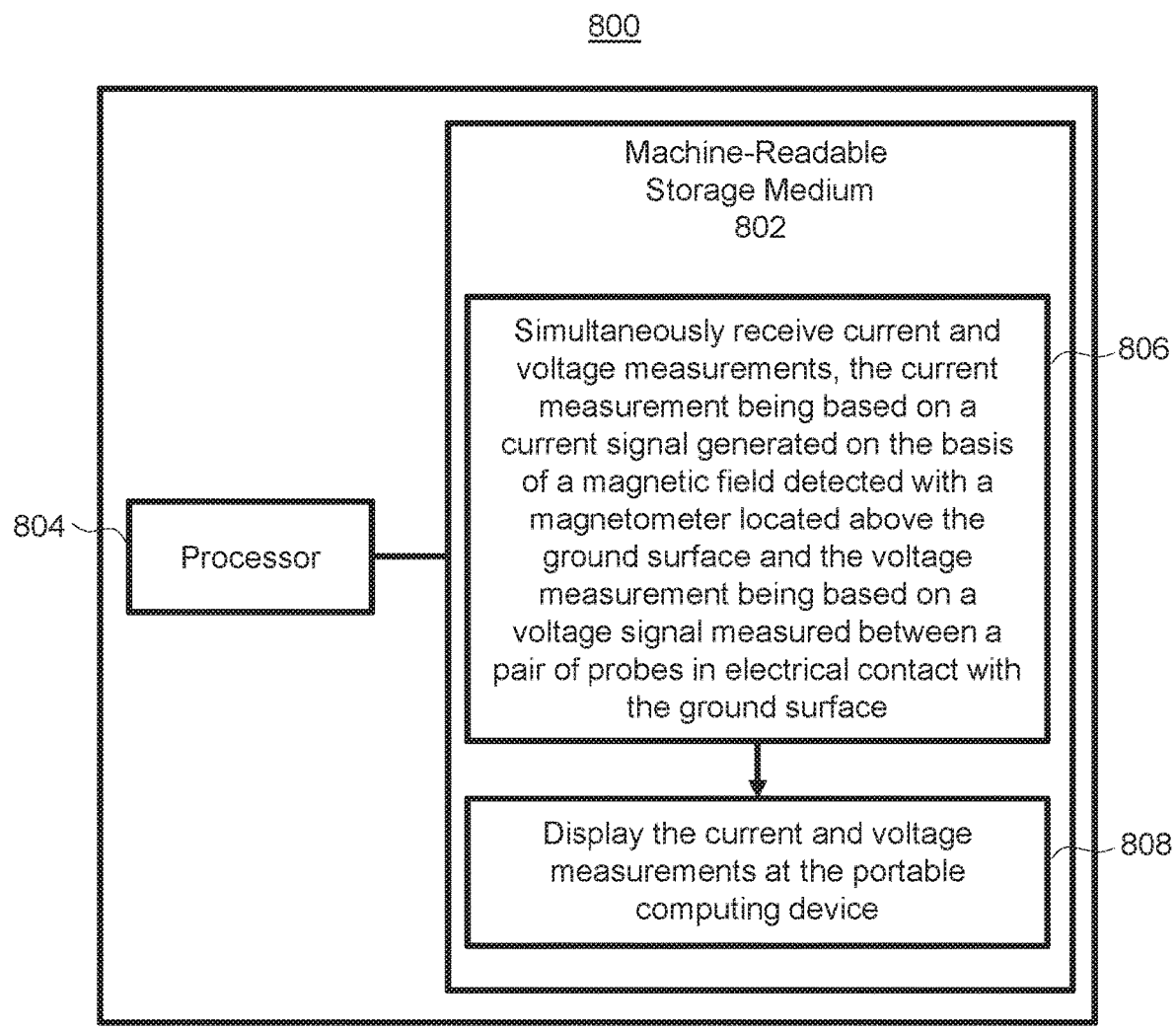
FIG. 9 a schematic diagram showing a processing device according to an example.

In this context, FIG. 9 shows an example of a processing device 800 comprising a machine-readable storage medium 802 coupled to a processor 804. In certain cases the processing device 800 may comprise a stand-alone computing device, such as a desktop computer or server communicatively coupled to fault detector; in other cases the processing device 800 may comprise part of a fault detector. The machine-readable medium 802 can be any medium that can contain, store, or maintain programs and data for use by or in connection with an instruction execution system. Machine-readable media can comprise any one of many physical media such as, for example, electronic, magnetic, optical, electromagnetic, or semiconductor media. More specific examples of suitable machine-readable media include, but are not limited to, a hard drive, a random access memory (RAM), a read-only memory (ROM), an erasable programmable read-only memory, or a portable disc. In FIG. 8, the machine-readable storage medium comprises program code to implement the methods described above.

At block 806, the processor 800 simultaneously receives current and voltage measurements. The current measurement is based on a current signal generated on the basis of a magnetic field detected with a magnetometer located above the ground surface. The voltage measurement is based on a voltage signal measured between a pair of probes in electrical contact with the ground surface.

At block 808, the processor 800 displays the current and voltage measurements at the portable computing device.

Additionally, the various aspects of the disclosure may be implemented in a non-generic computer implementation. In one aspect, the various processors may be implemented as fault detection processors, surveying processors, location detection processors, and the like. Moreover, the various aspects of the disclosure set forth herein improve the functioning of the system as is apparent from the disclosure hereof. Furthermore, the various aspects of the disclosure involve computer hardware that is specifically programmed to solve the complex problem addressed by the disclosure. Accordingly, the various aspects of the disclosure improve the functioning of the system overall in its specific implementation to perform the process set forth by the disclosure and as defined by the claims. Additionally, the disclosure provides meaningful limitations placed upon the application of the claimed operations to show that the claims are not directed to performing mathematical operations on a computer alone. Rather, the combination of elements impose meaningful limits in that the mathematical operations are applied to improve an existing technology by improving fault detection to extend the usefulness of the technology.

Aspects of the disclosure directed to proprietary communications and signalling technologies may include communication channels that may be any type of wired or wireless electronic communications network, such as, e.g., a wired/wireless local area network (LAN), a wired/wireless personal area network (PAN), a wired/wireless home area network (HAN), a wired/wireless wide area network (WAN), a campus network, a metropolitan network, an enterprise private network, a virtual private network (VPN), an internetwork, a backbone network (BBN), a global area network (GAN), the Internet, an intranet, an extranet, an overlay network, Near field communication (NFC), a cellular telephone network, a Personal Communications Service (PCS), using known protocols such as the Global System for Mobile Communications (GSM), CDMA (Code-Division Multiple Access), GSM/EDGE and UMTS/HSPA network technologies, Long Term Evolution (LTE), 5G (5th generation mobile networks or 5th generation wireless systems), WiMAX, HSPA+, W-CDMA (Wideband Code-Division Multiple Access), CDMA2000 (also known as C2K or IMT Multi-Carrier (IMT-MC)), Wireless Fidelity (Wi-Fi), Bluetooth, and/or the like, and/or a combination of two or more thereof. The NFC standards cover communications protocols and data exchange formats, and are based on existing radio-frequency identification (RFID) standards including ISO/IEC 14443 and FeliCa. The standards include ISO/IEC 18092[3] and those defined by the NFC Forum.

Aspects of the disclosure may be implemented in any type of computing devices, such as, e.g., a desktop computer, personal computer, a laptop/mobile computer, a personal data assistant (PDA), a mobile phone, a tablet computer, cloud computing device, and the like, with wired/wireless communications capabilities via the communication channels.

Aspects of the disclosure may be implemented in any type of mobile smartphones that are operated by any type of advanced mobile data processing and communication operating system, such as, e.g., an Apple™ iOS™ operating system, a Google™ Android™ operating system, a RIM™ Blackberry™ operating system, a Nokia™ Symbian™ operating system, a Microsoft™ Windows Mobile™ operating system, a Microsoft™ Windows Phone™ operating system, a Linux™ operating system or the like.

Further in accordance with various aspects of the disclosure, the methods described herein are intended for operation with dedicated hardware implementations including, but not limited to, PCs, PDAs, semiconductors, application specific integrated circuits (ASIC), microprocessors, programmable logic arrays, cloud computing devices, and other hardware devices constructed to implement the methods described herein.

According to an example, the global positioning unit or global positioning device may be any type of global navigation satellite system (GNSS) and may include a device and/or system that may estimate its location based, at least in part, on signals received from space vehicles (SVs). In particular, such a device and/or system may obtain "pseudorange" measurements including approximations of distances between associated SVs and a navigation satellite receiver. In a particular example, such a pseudorange may be determined at a receiver that is capable of processing signals from one or more SVs as part of a Satellite Positioning System (SPS). Such an SPS may comprise, for example, a Global Positioning System (GPS), Galileo, Glonass, to name a few, or any SPS developed in the future. To determine its location, a satellite navigation receiver may obtain pseudorange measurements to three or more satellites as well as their positions at time of transmitting. Knowing the SV orbital parameters, these positions can be calculated for any point in time. A pseudorange measurement may then be determined based, at least in part, on the time a signal travels from an SV to the receiver, multiplied by the speed of light. While techniques described herein may be provided as implementations of location determination in GPS and/or Galileo types of SPS as specific illustrations according to particular examples, it should be understood that these techniques may also apply to other types of SPS, and that claimed subject matter is not limited in this respect.

The application described in the disclosure may be implemented to execute on an Apple™ iOS™ operating system, a Google™ Android™ operating system, a RIM™ Blackberry™ operating system, a Nokia™ Symbian™ operating system, a Microsoft™ Windows Mobile™ operating system, a Microsoft™ Windows Phone™ operating system, a Linux™ operating system or the like. The application may be written in conjunction with the software developers kit (SDK) associated with an Apple™ iOS™ operating system, a Google™ Android™ operating system, a RIM™ Blackberry™ operating system, a Nokia™ Symbian™ operating system, a Microsoft™ Windows Mobile™ operating system, a Microsoft™ Windows Phone™ operating system, a Linux™ operating system or the like.

Aspects of the disclosure may include a server executing an instance of an application or software configured to accept requests from a client and giving responses accordingly. The server may run on any computer including dedicated computers. The computer may include at least one processing element, typically a central processing unit (CPU), and some form of memory. The processing element may carry out arithmetic and logic operations, and a sequencing and control unit may change the order of operations in response to stored information. The server may include peripheral devices that may allow information to be retrieved from an external source, and the result of operations saved and retrieved. The server may operate within a client-server architecture. The server may perform some tasks on behalf of clients. The clients may connect to the server through the network on a communication channel as defined herein. The server may use memory with error detection and correction, redundant disks, redundant power supplies and so on.

The above embodiments are to be understood as illustrative examples of the invention. Further embodiments of the invention are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A locator for detecting faults in an insulation layer of an insulated conductor buried beneath a ground surface, the insulated conductor carrying an alternating current, the locator comprising:
 a magnetometer arranged to detect a magnetic field generated by the alternating current and to generate a current signal on the basis of the detected magnetic field;
 a receiver comprising a pair of probes arranged to make electrical contact with the ground surface, the receiver being arranged to generate a voltage signal using the pair of probes; and
 a processor configured to (i) substantially synchronously sample the current signal and the voltage signal and (ii) determine, based on a variation in phase difference measurements of a phase difference determined between the current signal and the voltage signal, information regarding a length of a fault located in the insulation layer of the insulated conductor.

2. A locator according to claim 1, comprising a memory, wherein the processor is configured to store in the memory current measurements based on the processed current signal, voltage measurements based on the processed voltage signal and a phase measurement based on the determined phase difference between the current signal and voltage signal.

3. A locator according to claim 2, comprising a position locating device arranged to determine a position of the locator, wherein the processor is configured to store, in the memory, position information relating to the position of the locator when stored current and voltage measurements were measured.

4. A locator according to claim 3, wherein the processor is configured to determine a rate of phase difference with respect to distance determined on the basis of the position information.

5. A locator according to claim 2, comprising a communications interface for communicating with a portable computing device, wherein the processor is configured to transmit the current and voltage measurements to the portable computing device.

6. A locator according to claim 3, wherein the processor is configured to transmit the current and voltage measurements to the portable computing device in real time.

7. A locator according to claim 1, wherein the processor is configured to, in use, obtain survey measurement data, the survey measurement data comprising, for each of a plurality of different positions along a survey path traversed by the locator, a current measurement based on the current signal and a voltage measurement based on the voltage signal.

8. A locator according to claim 7, wherein the survey measurement data further comprises, for each of the plurality of different positions along the survey path traversed by the locator, the phase difference measurement of the phase difference between the current signal and the voltage signal.

9. A locator according to claim 8 wherein the insulated conductor is buried beneath the ground surface under the survey path, and
 wherein the receiver comprises an Alternating Voltage Gradient receiver such that the voltage signal is indicative of a voltage between the pair of probes.

10. A locator according to claim 9 wherein the information is an estimate of the length of the fault.

11. A locator according to claim 8, wherein the locator comprises a display and the processor is configured to cause a plot of at least one of: the current measurements; the voltage measurements; and the phase difference measurements against distance to be displayed on the display.

12. A locator according to claim 7, comprising a communications interface for communicating with an external computing device, wherein the processor is configured to transmit the current and voltage measurements to the portable computing device.

13. A locator according to claim 11 wherein the external computing device is a portable computing device.

14. A locator according to claim 9, wherein the alternating current carried in the insulated conductor has a low frequency component and a relatively higher frequency component, wherein the magnetometer is arranged to detect the magnetic field generated by the low frequency component.

15. A locator according to claim 14, comprising two magnetic field sensors each configured to generate a magnetic field signal in response to a magnetic field generated by the high frequency component, wherein the processor is configured to determine a depth of the insulated conductor based on the generated magnetic field signals.

16. A locator according to claim 14, wherein the low frequency component is less than 10 Hz.

17. A locator according to claim 16, wherein the low frequency component comprises a first low frequency component at approximately 4 Hz and a second low frequency component at approximately 8 Hz.

18. A locator according to claim 14, wherein the relatively higher frequency component is greater than 10 Hz.

19. A locator according to claim 18, wherein the relatively higher frequency component is approximately 128 Hz or approximately 98 Hz.

20. A locator according to claim 9, wherein the locator comprises a detector for locating the insulated conductor and the magnetometer is affixed to the detector and the Alternating Voltage Gradient receiver is mounted in a frame separate to the detector.

21. A locator according to claim 20, wherein, in use:
 the detector is to be carried in a first hand of an operator; and
 the frame is to be held in a second hand of the operator, different to the first hand.

22. A system for detecting faults in an insulation layer of an insulated conductor buried beneath a ground surface, the system comprising:
 a locator according to claim 1; and
 a signal generator arranged to apply an alternating current to the buried conductor.

23. A system according to claim 22, wherein the signal generator is arranged to apply an alternating current comprising a low frequency component and a high frequency component.

24. A system according to claim 22, comprising a portable computing device, the portable computing device comprising a communications interface arranged to communicate with the locator.

25. A system according to claim 24, wherein the portable computing device is arranged to receive, from the locator, data indicative of the current and voltage signals.

26. A system according to claim 25, wherein the portable computing device is arranged to receive data via a Bluetooth connection with the locator.

27. A system according to claim 25, wherein the portable computing device is arranged to display amplitude and phase information of the current and voltage measurements based on the received data.

28. A system according to claim 24, comprising a global position unit paired with the portable computing device, wherein position data from the global positioning unit is transmitted to the portable computing device.

29. A system according to claim 22, wherein the locator is arranged to transmit a signal to the signal generator to cause the signal generator to apply the alternating current to the buried conductor.

30. A system for detecting faults in an insulation layer of an insulated conductor buried beneath a ground surface, the system comprising:
a locator according to claim 7; and
a portable computing device arranged to receive, from the locator, the survey measurement data.

31. A system according to claim 30 wherein the portable computing device is arranged to determine from the survey measurement data for each of the plurality of different positions along the survey path traversed by the locator, the phase difference measurement of the phase difference between the current signal and the voltage signal.

32. A system according to claim 31 wherein the information is an estimate of the length of the fault.

33. A system according to claim 31, wherein the portable computing device comprises a display and the is configured to cause a plot of at least one of: the current measurements; the voltage measurements; and the phase difference measurements against distance to be displayed on the display.

34. A method of detecting faults in an insulation layer of an insulated conductor buried beneath a ground surface, the method comprising:
applying an alternating current to the buried conductor;
simultaneously detecting a magnetic field generated by the alternating current with a magnetometer located above the ground surface and measuring a voltage using a pair of probes in electrical contact with the ground surface;
generating a current signal on the basis of the detected magnetic field and generating a voltage signal indicative of the measured voltage;
determining, based on a variation in phase difference measurements of a phase difference determined between the current signal and the voltage signal, information regarding a length of a fault located in the insulation layer of the insulated conductor; and
processing the current signal and the voltage signal substantially simultaneously.

35. A method according to claim 34, comprising:
transmitting current and voltage measurements to a portable computing device; and displaying the current and voltage and phase measurements at the portable computing device.

36. A method according to claim 34, the method further comprising:
obtain survey measurement data, the survey measurement data comprising, for each of a plurality of different positions along a survey path traversed by the locator, a current measurement based on the current signal and a voltage measurement based on the voltage signal.

37. A method according to claim 36 wherein the survey measurement data further comprises, for each of the plurality of different positions along the survey path traversed by the locator, the phase difference measurement of the phase difference between the current signal and the voltage signal.

38. A method according to claim 37,
wherein the insulated conductor is buried beneath the ground surface under the survey path, and
wherein the voltage measurement is performed (i) using an Alternating Voltage Gradient receiver and (ii) between the pair of probes.

39. A method according to claim 38 wherein the information is an estimate of the length of the fault.

40. A method according to claim 37, the method further comprising:
presenting a plot of at least one of: the current measurements; the voltage measurements; and the phase difference measurements against distance to be displayed.

41. A method according to claim 40 wherein the plot is displayed on an electronic display.

42. A non-transitory machine-readable storage medium storing instructions that, when executed by a processor in a portable computing device, cause the processor to:
simultaneously receive current and voltage measurements, the current measurement being based on a current signal generated on the basis of a magnetic field detected with a magnetometer located above a ground surface and the voltage measurement being based on a voltage signal measured using a pair of probes in electrical contact with the ground surface;
determining a phase difference between the current signal and voltage signal;
determining, based on a variation in phase difference measurements of the determined phase difference, information regarding a length of a fault located in an insulation layer of an insulated conductor; and
display the current and voltage measurements and the determined phase difference at the portable computing device.

43. A non-transitory machine-readable storage medium storing instructions that, when executed by a processor in a locator for detecting faults in an insulation layer of an insulated conductor buried beneath a ground surface, cause the processor to:
receive a current signal generated by a magnetometer in response to the magnetometer detecting a magnetic field;
receive a voltage signal generated by an Alternating Voltage Gradient receiver, the voltage signal being indicative of a voltage between a pair of probes of the Alternating Voltage Gradient receiver;
determine a rate of phase difference with respect to a distance determined on the basis of a position information stored in a memory of the locator, the position information relating to a determined position of the locator when current and voltage measurements are measured, wherein the determining of the rate of phase measurements includes determining a phase difference between the current signal and voltage signal; and
process the current and voltage signals simultaneously.

* * * * *